(12) United States Patent
Inoue et al.

(10) Patent No.: US 8,546,840 B2
(45) Date of Patent: Oct. 1, 2013

(54) SEMICONDUCTOR LIGHT EMITTING ELEMENT

(75) Inventors: Yoshiki Inoue, Anan (JP); Keiji Emura, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/360,125

(22) Filed: Jan. 27, 2012

(65) Prior Publication Data
US 2012/0199868 A1 Aug. 9, 2012

(30) Foreign Application Priority Data

Feb. 7, 2011 (JP) .................................. 2011-23491

(51) Int. Cl.
*H01L 33/00* (2010.01)
(52) U.S. Cl.
USPC ..................................... 257/99; 257/E33.062
(58) Field of Classification Search
USPC ................ 257/79, 91, 99, E33.001, E33.055, 257/E33.062–E33.066; 438/22, 98
See application file for complete search history.

(56) References Cited

U.S. PATENT DOCUMENTS

| | | | | |
|---|---|---|---|---|
| 5,793,405 | A * | 8/1998 | Shakuda | 347/238 |
| 5,955,747 | A * | 9/1999 | Ogihara et al. | 257/88 |
| 6,777,805 | B2 | 8/2004 | Uemura et al. | |
| 6,885,036 | B2 * | 4/2005 | Tarsa et al. | 257/99 |
| 7,042,089 | B2 | 5/2006 | Uemura et al. | |
| 7,087,985 | B2 | 8/2006 | Park et al. | |
| 7,531,841 | B2 | 5/2009 | Ko et al. | |
| 7,880,184 | B2 * | 2/2011 | Iwafuchi et al. | 257/89 |
| 2004/0084684 | A1 * | 5/2004 | Tarsa et al. | 257/91 |
| 2004/0140473 | A1 * | 7/2004 | Chen | 257/79 |
| 2004/0195579 | A1 * | 10/2004 | Sonobe | 257/99 |
| 2005/0133807 | A1 * | 6/2005 | Park et al. | 257/99 |
| 2006/0192223 | A1 * | 8/2006 | Lee et al. | 257/99 |
| 2007/0085095 | A1 * | 4/2007 | Ko et al. | 257/94 |
| 2007/0252156 | A1 * | 11/2007 | Ogihara et al. | 257/79 |
| 2009/0140280 | A1 * | 6/2009 | Shen et al. | 257/98 |
| 2009/0179215 | A1 * | 7/2009 | Matsui et al. | 257/98 |
| 2010/0012969 | A1 * | 1/2010 | Yoon et al. | 257/99 |
| 2010/0059765 | A1 * | 3/2010 | Lester et al. | 257/79 |
| 2010/0102336 | A1 * | 4/2010 | Lee et al. | 257/88 |

(Continued)

FOREIGN PATENT DOCUMENTS

| | | |
|---|---|---|
| JP | 2001-345480 A | 12/2001 |
| JP | 2002-319704 A | 10/2002 |

(Continued)

*Primary Examiner* — Thao P. Le
(74) *Attorney, Agent, or Firm* — Global IP Counselors, LLP

(57) ABSTRACT

The present invention provides a semiconductor light emitting element having; a semiconductor layer where an n-type semiconductor layer, a light emitting layer and a p-type semiconductor layer are laminated; an n-side electrode connected to the n-type semiconductor layer; and a p-side electrode connected to the p-type semiconductor layer; when the semiconductor light emitting element is viewed from above, the n-side electrode has a n-side pad electrode and n-side extension, the n-side extension comprises an n-side first extension extending from the n-side pad electrode toward the p-side pad electrode and an n-side second extension extending from the n-side first extension and formed T shape with the n-side first extension, the p-side electrode has a p-side pad electrode and a p-side extension formed so as to surround the n-side electrode, the p-side side extension comprises an p-side first extension extending from the p-side pad electrode parallel to the n-side second extension.

21 Claims, 6 Drawing Sheets

(56) References Cited

U.S. PATENT DOCUMENTS

| | | | |
|---|---|---|---|
| 2010/0109026 A1* | 5/2010 | Onushkin et al. | 257/88 |
| 2010/0140656 A1* | 6/2010 | Kim et al. | 257/99 |
| 2010/0155752 A1* | 6/2010 | Lim et al. | 257/94 |
| 2010/0258836 A1* | 10/2010 | Wang et al. | 257/99 |
| 2011/0156070 A1* | 6/2011 | Yoon et al. | 257/98 |
| 2011/0156086 A1* | 6/2011 | Kim et al. | 257/99 |
| 2011/0210345 A1* | 9/2011 | Lim et al. | 257/88 |
| 2011/0215363 A1* | 9/2011 | Kimura et al. | 257/99 |
| 2011/0272730 A1* | 11/2011 | Bae et al. | 257/99 |
| 2012/0018766 A1* | 1/2012 | Emura | 257/99 |
| 2012/0043566 A1* | 2/2012 | Wu et al. | 257/94 |
| 2013/0009197 A1* | 1/2013 | Seo et al. | 257/99 |

FOREIGN PATENT DOCUMENTS

| | | |
|---|---|---|
| JP | 2003-179263 A | 6/2003 |
| JP | 2005-183910 A | 7/2005 |
| JP | 2007-281426 A | 10/2007 |
| JP | 1413566 | 5/2011 |

* cited by examiner

SEMICONDUCTOR LIGHT EMITTING ELEMENT

CROSS-REFERENCE TO RELATED APPLICATIONS

This application claims priority to Japanese Patent Application No. 2011-23491 filed on Feb. 7, 2011. The entire disclosure of Japanese Patent Application No. 2011-23491 is hereby incorporated herein by reference.

BACKGROUND

1. Technical Field

The present invention relates to a semiconductor light emitting element with reduced emission unevenness.

2. Background Art

A known way to reduced emission unevenness with a conventional semiconductor light emitting element is to extend a slender p-side electrode from a p pad electrode connected to an external power supply (see Patent Literature 1: JP2007-281426A, for example). A known way to further reduced emission unevenness is to use a semiconductor light emitting element in which linear p-side electrodes extending from a p pad electrode are alternated with n-side electrodes extending from an n pad electrode (see Patent Literature 2: JP2002-319704A, Patent Literature 3: JP2001-345480, for example).

With another semiconductor light emitting element, an n-side electrode provided inside a light emission region is surrounded by a p-side electrode provided with an extension (see Patent Literature 4: JP2005-183910A, Patent Literature 5: JP2003-179263, for example).

However, in Patent Literature 1, the electrode extending from one pad electrode extends linearly over the other pad electrode, so there is a portion where current accumulates. In Patent Literature 2, the end part of the electrode is separated by a considerable distance from the pad to which current is supplied, so there is a portion where the output is lower than at the other, adjacent portions. In Patent Literature 3, the electrode extending from one pad electrode extends linearly over the other pad electrode, so there is a portion where current accumulates. In Patent Literature 4 and 5, current is supplied to only one p pad electrode, so there is a difference in brightness between the emission between the p pad electrode and the n pad electrode, and emission between the n pad electrode and electrodes other than the p pad electrode.

SUMMARY

In view of this, it is an object of the present invention to provide a semiconductor light emitting element with reduced emission unevenness.

The present invention provide inventions <1> to <6> described below.

<1> a semiconductor light emitting element having;

a semiconductor layer where an n-type semiconductor layer, a light emitting layer and a p-type semiconductor layer are laminated;

an n-side electrode connected to the n-type semiconductor layer; and a p-side electrode connected to the p-type semiconductor layer;

when the semiconductor light emitting element is viewed from above, the n-side electrode has a n-side pad electrode and n-side extension, the n-side extension comprises an n-side first extension extending from the n-side pad electrode toward the p-side pad electrode and an n-side second extension extending from the n-side first extension and formed T shape with the n-side first extension, the p-side electrode has a p-side pad electrode and a p-side extension formed so as to surround the n-side electrode, the p-side side extension comprises an p-side first extension extending from the p-side pad electrode parallel to the n-side second extension.

<2> The semiconductor light emitting element according to <1>, wherein a length of the n-side second extension is greater than the diameter of the p-side pad electrode.

<3> The semiconductor light emitting element according to <1> or <2>, wherein a p-side extension is formed C shape with a partial opening.

<4> The semiconductor light emitting element according to any one of <1> to <3>, wherein the p-side extension further has a p-side second extension extending from the p-side first extension parallel to the n-side first extension, and the shortest distance between the p-side pad electrode and the n-side second extension is longer than the shortest distance between the p-side second extension and the n-side second extension.

<5> The semiconductor light emitting element according to <4>, wherein the p-side extension further has a p-side third extension extending from the p-side second extension toward the n-side first extension.

<6> The semiconductor light emitting element according to any one of <1> to <5>, wherein the n-side pad electrode is greater than the p-side pad electrode.

According to the semiconductor light emitting element of the present invention, the emission unevenness can be reduced and improved. "Emission unevenness" here refers to when the emission from the light emitter does not look uniform when seen from the light extraction face side, and refers to a portion where the light is darker than elsewhere, for example. Reducing (improving) emission unevenness means bringing the emission of the light closer to being uniform.

According to the semiconductor light emitting element of the present invention, the Vf can also be reduced.

BRIEF DESCRIPTION OF THE DRAWINGS

Referring now to the attached drawings which form a part of this original disclosure.

DETAILED DESCRIPTION OF EXEMPLARY EMBODIMENTS

Embodiments of the present invention will now be described in detail through reference the drawings. In the following description, terms indicating specific directions and positions will be used as needed (such as "up," "down," "right," "left," and other terms including these terms). The use of these terms is intended to facilitate an understanding of the invention through reference to the drawings, and the technological scope of the present invention is not limited by the meaning of these terms. Portions that are numbered the same in different drawings indicate the same portions or members. Also, embodiments are divided up and described separated in order to make the invention easier to understand, but these embodiments are not independent of one another, and the description of other embodiments can be applied to shared features.

First Embodiment

Figure 1:
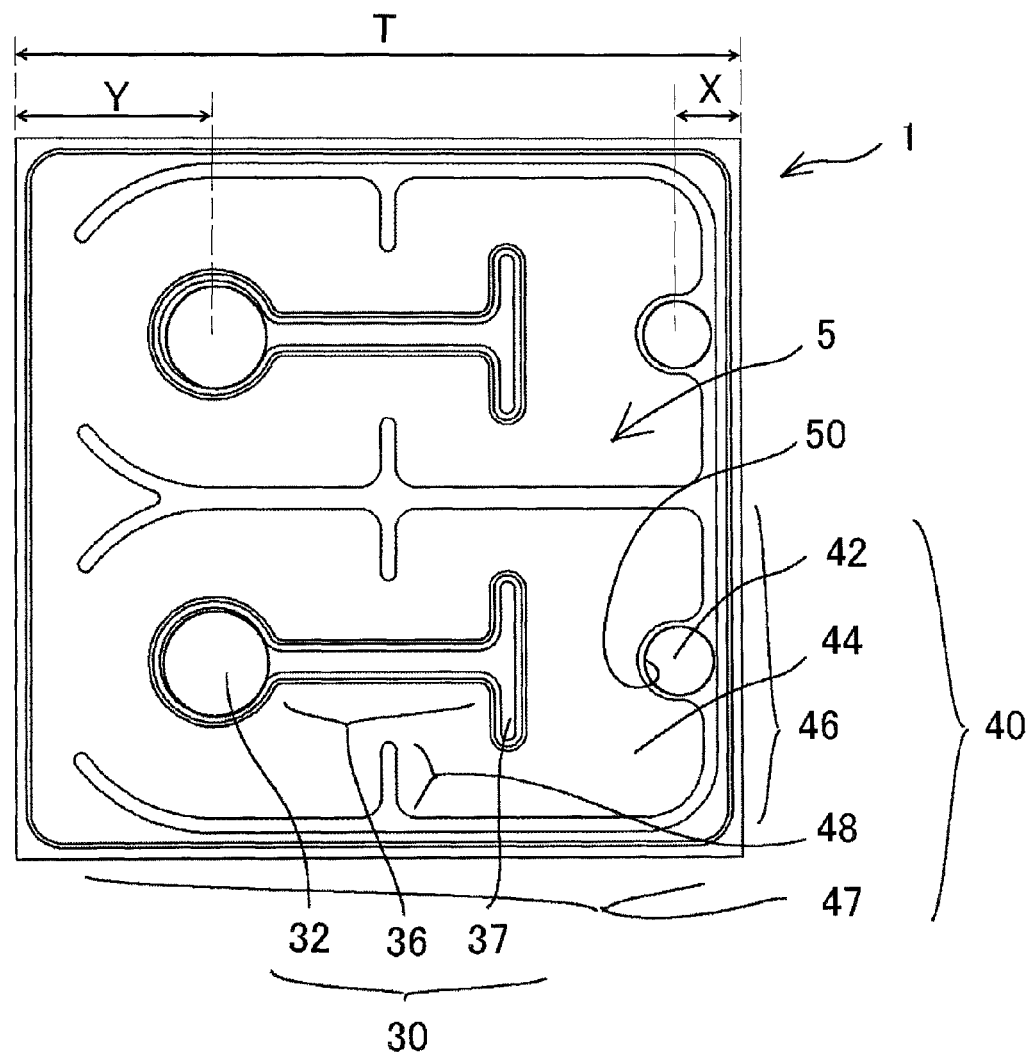
FIG. 1 is a schematic plan view of the semiconductor light emitting element pertaining to the first embodiment.
Figure 2:
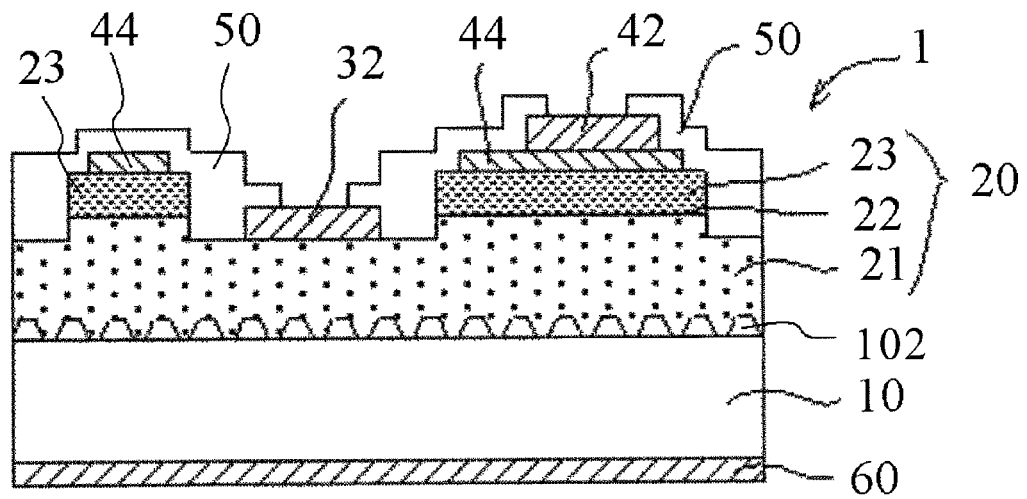
FIG. 2 is a schematic cross sectional view illustrating a structure of a semiconductor light emitting element pertaining to the first embodiment.
Figure 3:
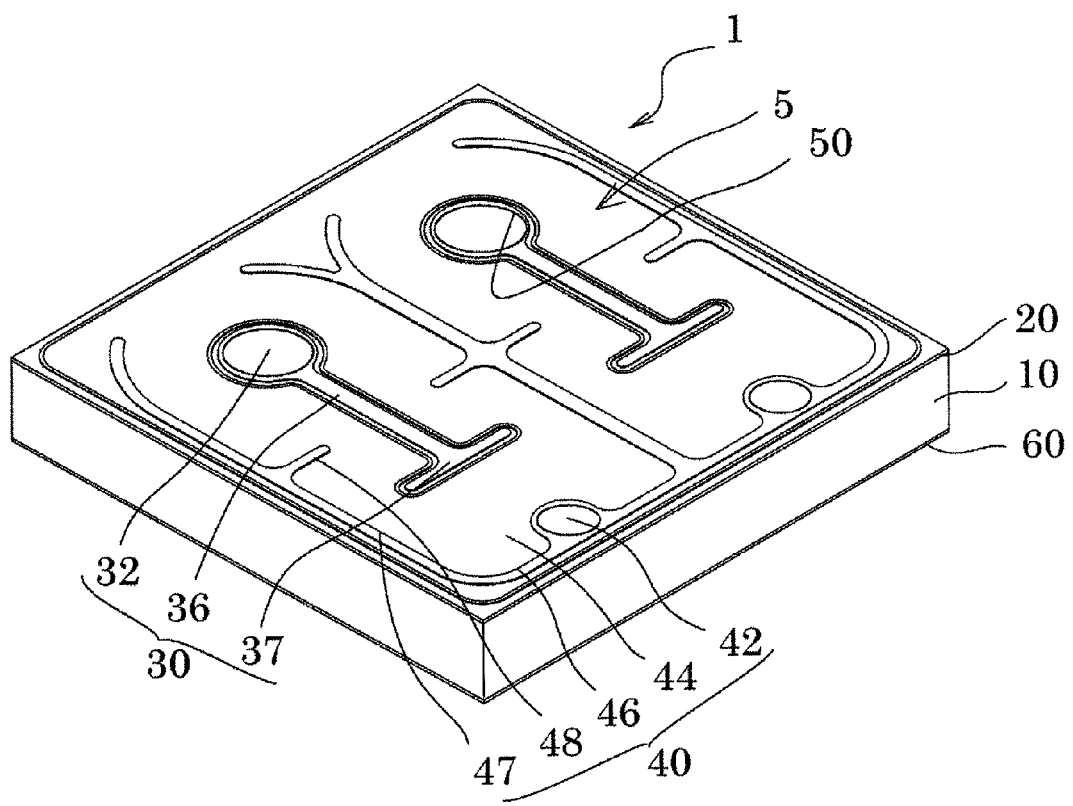
FIG. 3 is an oblique perspective view illustrating a structure of a semiconductor light emitting element pertaining to the first embodiment.

The semiconductor light emitting element pertaining to a first embodiment will be discussed in detail through reference to the drawings. FIG. 1 is a schematic plan view of the semiconductor light emitting element pertaining to the first embodiment. FIG. 2 is a schematic cross sectional view illustrating a structure of a semiconductor light emitting element pertaining to the first embodiment. FIG. 3 is an oblique perspective view illustrating a structure of a semiconductor light emitting element pertaining to the first embodiment. For the purposes of description, FIGS. 1 and 2 are not drawn in the same scale. The plan view of the semiconductor light emitting element will be called the top face.

The semiconductor light emitting element 1 pertaining to the first embodiment comprises a semiconductor layer 20 in which an n-type semiconductor layer 21, a light emitting layer 22, and a p-type semiconductor layer 23 are laminated in that order on a substrate 10. Viewing the semiconductor light emitting element 1 from above, the p-type semiconductor layer 23 and the light emitting layer 22 are partially removed to expose the n-type semiconductor layer 21. When power is supplied, in a light emitter 5, it can be seen to emit light from the p-type semiconductor layer 23, but not the exposed n-type semiconductor layer 21. The top face of the semiconductor light emitting element 1, other than parts of an n-side pad electrode 32 and a p-side pad electrode 42, is covered by an insulating protective film 50 that prevents short circuiting. The back face of the substrate 10 is given a metallization layer 60.

The semiconductor light emitting element 1 includes two pairs of an n-side electrode 30 and a p-side electrode 40. Also, there may be two or more pairs of the n-side electrode and the p-side electrode.

The p-side electrode 40 includes the p-side pad electrode 42, a p-side translucent electrode 44, and p-side extensions (a p-side first extension 46, a p-side second extension 47, and a p-side third extension 48). The p-side translucent electrode 44 is provided over the p-type semiconductor layer 23, the p-side translucent electrode 44 is electrically connected to the p-side pad electrode 42, and the p-side pad electrode 42 is electrically connected to the p-side extensions. The p-side first extension 46, the p-side second extension 47 and the p-side third extension 48 are formed continuously, in the form of two side-by-side U or C shapes.

The n-side electrode 30 includes the n-side pad electrode 32 and n-side extensions (an n-side first extension 36 and an n-side second extension 37). The n-side pad electrode 32 is provided over the n-type semiconductor layer 21, and the n-side pad electrode 32 is electrically connected to the n-side extensions. The n-side first extension 36 and the n-side second extension 37 are formed continuously, in the form of T shape. The T shape of n-side extensions can provides with a current damming effect, therefore, this can reduce emission unevenness. There are two T shapes in one semiconductor light emitting element in this embodiment.

The p-side pad electrode 42 is disposed near the outer periphery of the semiconductor light emitting element 1, the purpose of which is to make wire bonding easier. However, the p-side pad electrode 42 may instead be disposed somewhat more to the inside of the semiconductor light emitting element 1. For example, when the length of one side of the semiconductor light emitting element 1 is one (see "T" in FIG. 1), the distance X (in FIG. 1) between the center of the p-side pad electrode 42 and a side of semiconductor light emitting element 1 which is opposite side to a side closest to the n-side pad electrode 32 may be 0.15 to 0.30. This is because light is also emitted all the way to the outer periphery of the semiconductor light emitting element 1 closest to the p-side pad electrode 42.

The p-side pad electrode 42, the p-side first extension 46, the p-side second extension 47 and the p-side third extension 48 are formed on part of the surface of the p-side translucent electrode 44 provided on the p-type semiconductor layer 23. The p-side first extension 46, the p-side second extension 47 and the p-side third extension 48 are formed so as to surround the n-side electrode 30 in a C shape. In other wards, the p-side electrode may completely surrounds the n-side electrode 30 as with a circle, but preferably there is a partial opening, such as with a U or C shape. This allows the light emitting portion to have a larger area.

The p-side first extension 46 extends from the p-side pad electrode 42 in a direction perpendicular to the direction which is extending toward the n-side pad electrode 32 from the p-side pad electrode 42. The p-side second extension 47 extends perpendicularly from the p-side first extension 46. The p-side third extension 48 extends perpendicularly from the p-side second extension 47. That is, the p-side third extension 48 extends toward the n-side first extension. This further reduces emission unevenness by shortening the distance between the n-side first extension and the p-side extension.

The intersection between the p-side first extension 46 and the p-side second extension 47 is rounded here, but may be a right angle. The p-side second extension 47 has a portion that extends in a straight line and a portion that is curved at the distal end. This curve at the distal end of the p-side second extension 47 is preferably an arc shape so as to be equidistant from the circular shape of the n-side pad electrode 32. This is because the n-side pad electrode 32 will be equidistant from the area near the distal end of the p-side second extension 47, making it easier for the light to be emitted uniformly. Furthermore, the p-side third extension 48 extends toward the n-side first extension 36.

Also, the p-side first extension 46 and the p-side second extension 47 (excluding the middle of the three) are preferably disposed at the outer periphery of the semiconductor light emitting element 1. This increases the light emission surface area, so the outer periphery of the semiconductor light emitting element 1 is less apt to be darker.

The n-side pad electrode 32 is formed independently within the region of light emission by etching the p-type semiconductor layer 23 and the light emitting layer 22 in a circular shape when viewed from above. When the length of one side of the semiconductor light emitting element 1 is one (see "T" in FIG. 1), the distance Y (in FIG. 1) between the center of the n-side pad electrode 32 and a side of semiconductor light emitting element 1 which is opposite side of to a side closest to the p-side pad electrode 42 may be 0.20 to 0.35. That is, the distance between the center of the n-side pad electrode 32 and the center of the p-side pad electrode 42 may be 0.75 to 0.60. In particular, the distance Y is preferably 0.25 to 0.30, and the distance between the center of the n-side pad electrode 32 and the center of the p-side pad electrode 42 is preferably 0.65 to 0.60.

The n-side pad electrode 32, the n-side first extension 36 and the n-side second extension 37 are formed over the n-type semiconductor layer 21. The n-side first extension 36 and the n-side second extension 37 are formed in a T shape. The n-side first extension 36 extends in a straight line from the n-side pad electrode 32 toward the p-side pad electrode 42. The n-side second extension 37 extends perpendicularly from the n-side first extension 36.

The n-side first extension 36 and the p-side second extension 47 have parallel portions. The n-side second extension 37 and the p-side first extension 46 also have parallel portions. The n-side second extension 37 and the p-side third extension 48 also have parallel portions.

The length of the n-side second extension 37 is preferably greater than the diameter of the p-side pad electrode 42. This is because it allows the current damming effect to be enhanced. It is also preferable for the length of the n-side second extension 37 to be greater than the diameter of the n-side pad electrode 32. This is because it allows the current damming effect to be enhanced.

Viewing the semiconductor light emitting element 1 from above, the n-side pad electrode 32 is preferably larger than the p-side pad electrode 42. This is because the distance between the p-side second extension 47 and the n-side pad electrode 32 can be shortened. The distances between the distal end portion of the p-side second extension 47 and the n-side pad electrode 32 are preferably equidistant. The distances between the straight portion of the p-side second extension 47 and the n-side first extension 36 are also preferably equidistant. The distances between the portion surrounded by distal end portion, straight portion of the p-side second extension 47 and the p-side third extension 48, and the n-side pad electrode 32 may be equidistant, respectively, but since the n-side first extension 36 is there, the n-side pad electrode 32 is preferably offset in the distal end direction of the p-side second extension 47 (the direction moving away from the p-side pad electrode 42). The shortest distance between the p-side pad electrode 42 and the n-side second extension 37 is preferably longer than the shortest distance between the p-side second extension 47 (in particular the straight portion of the p-side second extension 47) and the n-side second extension 37. This is because current accumulation can be reduced. The length of the n-side second extension 37 is preferably about half the length of the p-side first extension 46, and the length of the p-side third extension 48 is preferably about half the length of the p-side first extension 46. The distance between the n-side second extension 37 and the p-side second extension 47 is preferably equal to the distance between the p-side third extension 48 and the n-side first extension 36.

However, viewing the semiconductor light emitting element 1 from above, the n-side pad electrode 32 can also be the same size as or smaller than the p-side pad electrode 42. This is because making the n-side pad electrode 32 smaller allows the light emitter 5 to be larger. It is preferable here for the n-side pad electrode 32 and the p-side second extension 47 to be moved closer together.

There are two pairs of the n-side electrode 30 and the p-side electrode 40. The two p-side electrodes 40 may be formed separately, but preferably share the p-side second extension 47. The distal end of the p-side second extension 47 here is preferably split so as to be equidistant from the corresponding n-side pad electrodes 32 to the split distal ends of the p-side second extension 47, respectively.

Having two p-side pad electrodes 42 allows the semiconductor light emitting element 1 to be formed in a square shape when viewed from above. Sharing a p-side second extension 47 between the two p-side pad electrodes 42 results in there being three p-side second extensions 47. This reduces emission unevenness. This is because if there are four p-side second extensions 47, it will be darker between the two on the inner side.

(Substrate 10)

The substrate is formed from a material that is suited to the epitaxial growth of semiconductor crystals. Examples of substrates that are suited to the epitaxial growth of a nitride semiconductor include insulating substrates of sapphire ($Al_2O_3$) or spinel ($MgAl_2O_4$) having a main plane that is the C plane, A plane, or R plane; SiC (6H, 4H, and 3C), Si, ZnS, ZnO, GaAs, diamond; and $LiNbO_3$, $NdGaO_3$, and other such oxide substrates, nitride semiconductor substrates (GaN, AlN, etc.), and so forth. A substrate having an off-angle semiconductor growth plane, or a substrate provided with texturing 102 may also be used. The substrate can also be removed at the end. If the substrate is translucent, then the other main face side that is opposite the main face on which the semiconductor element structure is laminated can be used as the light extraction face.

(Semiconductor layer 20)

A so-called light emitting diode, a laser diode, or the like is favorable as the light emitter of the semiconductor light emitting element. There are no particular restrictions on the shape of the light emitter, but examples include a circular shape, an elliptical shape, a polygonal shape, and shapes that are close to these. A triangular shape, tetragonal shape, hexagonal shape, or other such shape is particularly favorable because a plurality of light emitters can be disposed more compactly.

Examples of the light emitter include homostructure, heterostructure and double heterostructure such as MIS, PIN, PN and other such structures. The light emitting layer may have a multiple quantum well structure or a single quantum well structure which are formed by thin films so as to cause quantum effect. The light emitting layer is sometimes doped with silicon, germanium, or another such donor impurity, or with zinc, magnesium or another such acceptor impurity. The emission wavelength of the resulting semiconductor light emitting element can be varied from the ultraviolet band to the infrared band by changing the material of the semiconductor, the mixed crystal ratio, the indium content of InGaN in the light emitting layer, the type of impurity with which the light emitting layer is doped, and so forth.

The n-side semiconductor layer, the light emitting layer and p-side semiconductor layer of the light emitter can be formed from, for example, a nitride semiconductor such as InN, AlN, GaN, InGaN, AlGaN, InGaAlN, or other semiconductor. In particular, the n-side semiconductor layer, the light emitting layer and p-side semiconductor layer of the light emitter is preferably formed from a nitride semiconductor.

Examples of the light emitter formed from nitride semiconductor include a buffer layer of AlGaN, an undoped GaN layer, an n-side contact layer of Si-doped GaN, an n-side cladding layer of superlattice structure laminated with alternating layers of GaN and InGaN, a light emitting layer of multiple quantum well structure laminated with alternating layers of GaN and InGaN, a p-side cladding layer of superlattice structure laminated with alternating layers of Mg-dopoed AlGaN and Mg-dopoed GaN, and a p-side contact layer of Mg-doped GaN layer.

(N-side Electrode 30 and P-Side Electrode 40)

The n-side electrode is made up of a pad electrode and extensions, and the p-side electrode is made up of a pad electrode, a translucent electrode, and extensions. The extensions are electrically connected to the corresponding pad electrodes. The material of the electrodes is generally selected to that the extensions can be connected in a state of low resistance. If the electrodes are provided with a laminated structure, the material can be a metal such as gold, platinum, palladium rhodium, nickel, tungsten, molybdenum, chromium, or titanium, or an alloy or combination of these. To give a specific example, Ti/Rh/Au, W/Pt/Au, Rh/Pt/Au, W/Pt/Au/Ni, Pt/Au, Ti/Rh are used, starting from the side connected to the p-side translucent electrode 44 or the nitride semiconductor layer.

The p-side translucent electrode provided to the p-type semiconductor layer on the light emitter is preferably provided over the entire surface of the p-type semiconductor layer. The light from the light emitting layer goes through this p-side translucent electrode before being released to the outside. Accordingly, a material with high optical transmissivity at the wavelength band of the light generated by the light emitting layer can be used to advantage for the p-side translucent electrode. Examples of the p-side translucent electrode include conductive oxide containing at least one element comprising In, Zn, Sn, Ga. W, Ti, such as ITO, IZO, ZnO, $In_2O_3$, $SnO_2$, $TiO_2$ and composite oxide thereof.

(Protective Film 50)

A protective film covers the entire surface of the light emitter, excluding part of the top face of the n-side pad electrode and p-side pad electrode. The material of the protective film can be a single-layer or multilayer film of $SiO_2$, $Al_2O_3$, $ZrO_2$, $TiO_2$, or the like. Providing a protective film prevents shorting and the like, and increases the yield and reliability.

(Metallization Layer 60)

The back face of the semiconductor light emitting element is metalized. The purpose of this is to more efficiently reflect the light emitted from the semiconductor layer to the top face side. This metallization is preferably involves providing a material with high reflectivity over the entire surface of the substrate. Metallization layer's materials include aluminum, silver, and the like.

Second Embodiment

Figure 4:
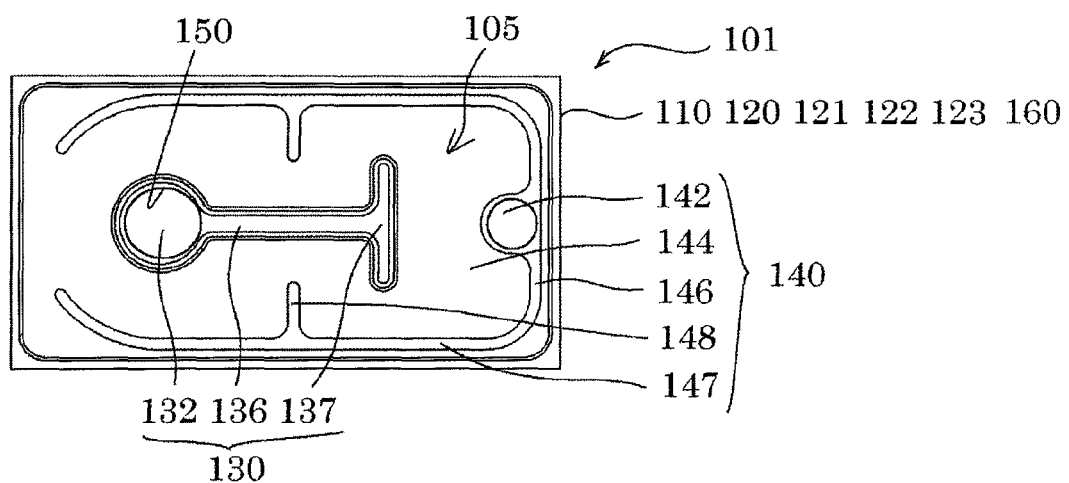
FIG. 4 is a schematic plan view of the semiconductor light emitting element pertaining to the second embodiment.
Figure 5:
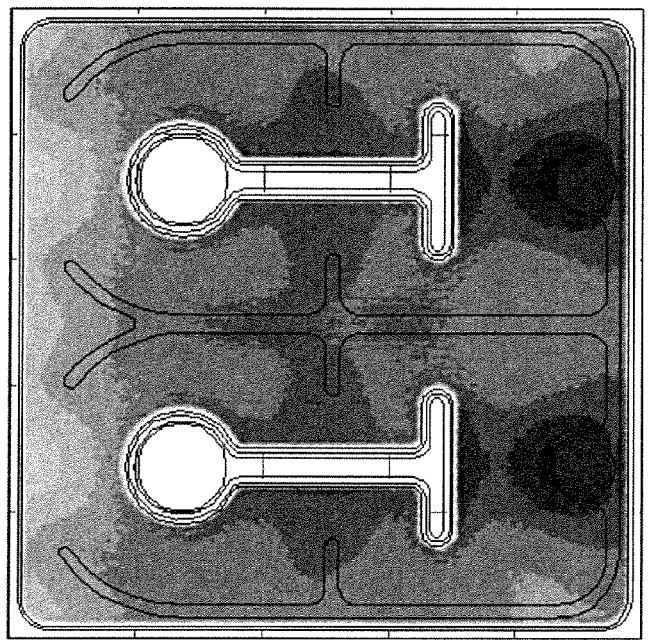
FIG. 5 is a simulation diagram illustrating a distribution of light of the semiconductor light emitting element pertaining to the Working example 1.
Figure 5:
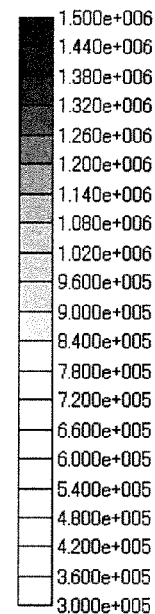
Figure 6:
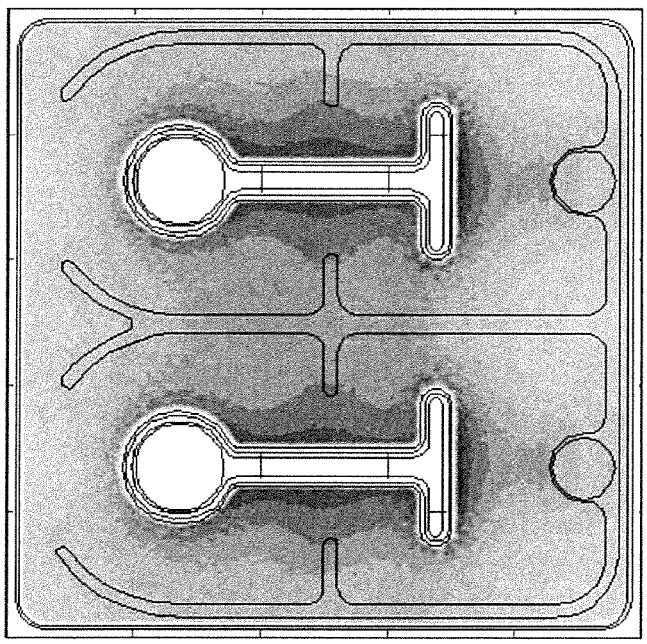
FIG. 6 is a simulation diagram illustrating a distribution of light of the semiconductor light emitting element pertaining to the Working example 2.
Figure 6:
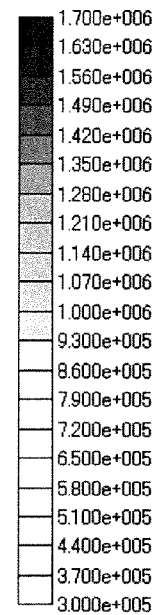
Figure 7:
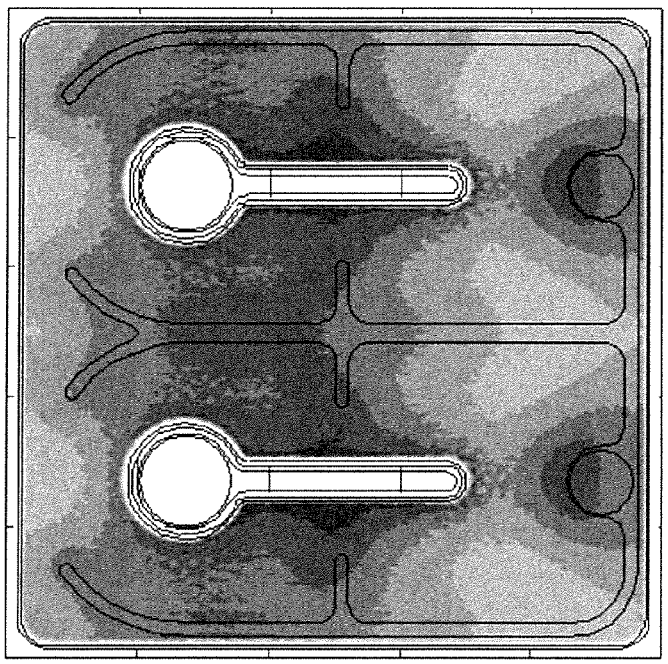
FIG. 7 is a simulation diagram illustrating a distribution of light of the semiconductor light emitting element pertaining to the Comparative example 1.
Figure 8:
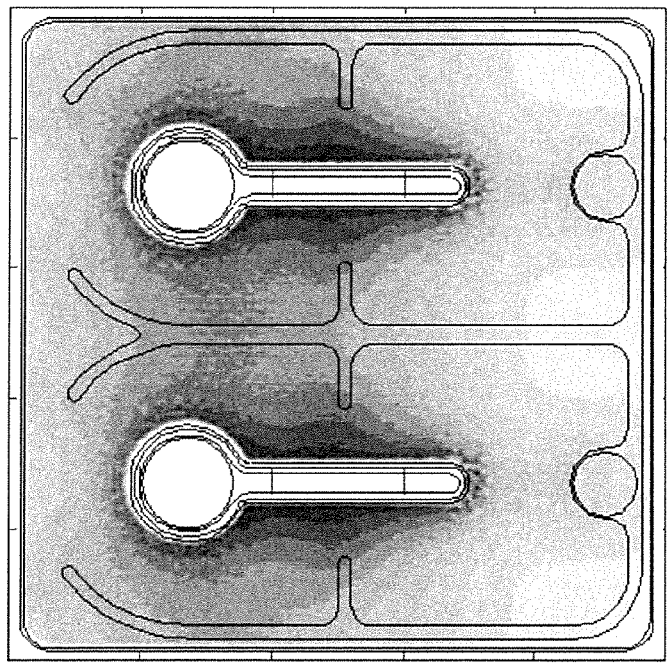
FIG. 8 is a simulation diagram illustrating a distribution of light of the semiconductor light emitting element pertaining to the Comparative example 2.

A semiconductor light emitting element 101 pertaining to a second embodiment is substantially the same as the semiconductor light emitting element 1 pertaining to the first embodiment, except that the numbers of n-side electrodes and p-side electrodes are different. FIG. 4 is a simplified plan view of the semiconductor light emitting element pertaining to this second embodiment.

The semiconductor light emitting element 101 pertaining to the second embodiment comprises a semiconductor layer 120 in which an n-type semiconductor layer 121, a light emitting layer 122, and a p-type semiconductor layer 123 are laminated in that order on a substrate 110. Viewing the semiconductor light emitting element 101 from above, the p-type semiconductor layer 123 and the light emitting layer 122 are partially removed to expose the n-type semiconductor layer 121. When power is supplied, in a light emitter 105, it can be seen to emit light from the p-type semiconductor layer 123, but not the exposed n-type semiconductor layer 121. The top face of the semiconductor light emitting element 101, other than parts of an n-side pad electrode 132 and a p-side pad electrode 142, is covered by an insulating protective film 150 that prevents short circuiting. The back face of the substrate 110 is given a metallization layer 160.

The semiconductor light emitting element 101 includes two pairs of an n-side electrode 130 and a p-side electrode 140.

The p-side electrode 140 includes the p-side pad electrode 142, a p-side translucent electrode 144, and p-side extensions (a p-side first extension 146, a p-side second extension 147, and a p-side third extension 148). The p-side translucent electrode 144 is provided over the p-type semiconductor layer 123, the p-side translucent electrode 144 is electrically connected to the p-side pad electrode 142, and the p-side pad electrode 142 is electrically connected to the p-side extensions. The p-side first extension 146, the p-side second extension 147 and the p-side third extension 148 are formed continuously, in the form of U shapes. The distal ends of the p-side second extension 147 are an arc shape so as to be equidistant from an n-side pad electrode 132.

Thus, emission unevenness can be reduced even if the semiconductor light emitting element 101 is rectangular when viewed from above.

Working Examples

In describing the semiconductor light emitting element pertaining to working examples, the parts that are the same as in the semiconductor light emitting element 1 pertaining to the first embodiment will be omitted.

Working Examples 1 and 2 have the same constitution, except for the thickness of the n-type semiconductor layer 21. That is, the thickness of the n-type semiconductor layer 21 in Working Example 2 is one-half the thickness of the n-type semiconductor layer 21 in Working Example 1.

The semiconductor light emitting element 1 pertaining to Working Examples 1 and 2 comprises a semiconductor layer 20 in which an n-type semiconductor layer 21, a light emitting layer 22, and a p-type semiconductor layer 23 are laminated in that order on a substrate 10. Viewing the semiconductor light emitting element 1 from above, the p-type semiconductor layer 23 and the light emitting layer 22 are partially removed to expose the n-type semiconductor layer 21. The top face of the semiconductor light emitting element 1, other than parts of an n-side pad electrode 32 and a p-side pad electrode 42, is covered by an insulating protective film 50 that prevents short circuiting. The back face of the substrate 10 is given a metallization layer 60.

The semiconductor light emitting element 1 includes two pairs of an n-side electrode 30 and a p-side electrode 40.

The p-side electrode 40 includes the p-side pad electrode 42, a p-side translucent electrode 44, and p-side extensions (a p-side first extension 46, a p-side second extension 47, and a p-side third extension 48). The p-side translucent electrode 44 is provided over the p-type semiconductor layer 23, the p-side translucent electrode 44 is electrically connected to the p-side pad electrode 42, and the p-side pad electrode 42 is electrically connected to the p-side extensions. The p-side first extension 46, the p-side second extension 47 and the p-side third extension 48 are formed continuously, in the form of two side-by-side U shapes.

The n-side electrode 30 includes the n-side pad electrode 32 and n-side extensions (an n-side first extension 36 and an n-side second extension 37). The n-side pad electrode 32 is provided over the n-type semiconductor layer 21, and the n-side pad electrode 32 is electrically connected to the n-side extensions. The n-side first extension 36 and the n-side second extension 37 are formed continuously, in the form of two T shapes.

Sapphire is used for the substrate 10. The top face of the sapphire on the side on which the n-type semiconductor layer 21 is formed is textured. The n-type semiconductor layer 21, the light emitting layer 22, and the p-type semiconductor layer 23 are laminated nitride semiconductors. The main wavelength is 405 nm. The size of the semiconductor light emitting element 1 is 1000 µm×1000 µm×150 µm. The thickness of the n-type semiconductor layer 21 in Working Example 1 is 6.0 µm, whereas the thickness of the n-type semiconductor layer 21 in Working Example 2 is 3.0 µm.

The diameter of the n-side pad electrode 32 is 140 µM, and the diameter of the p-side pad electrode 42 is 100 µm. The n-side pad electrode 32 and the p-side pad electrode 42 have a laminated structure including titanium, rhodium, tungsten, and gold, and the p-side translucent electrode 44 is made of ITO. The protective film 50 is an $SiO_2$ covering 200 nm thick. The metallization layer 60 consists of aluminum.

Comparative Example 1 has the same constitution as Working Example 1, except that there is no n-side second extension. Similarly, Comparative Example 2 has the same constitution as Working Example 2, except that there is no n-side second extension. The thickness of the n-type semiconductor layer in Comparative Example 1 is 6.0 µm, while the thickness of the n-type semiconductor layer in Comparative Example 2 is 3.0

As a result of the above constitutions and from the simulation diagrams of the FIGS. 5 to 8, illustrating a distribution of light of the semiconductor light emitting element pertaining to the Working examples 1, 2 and Comparative examples 1, 2, providing the n-side second extension 37 in Working Example 1 affords a more uniform current density distribution than when no n-side second extension is provided as in Comparative Example 1. The current density distribution is particularly uniform around the n-side first extension 36.

Figure 9:
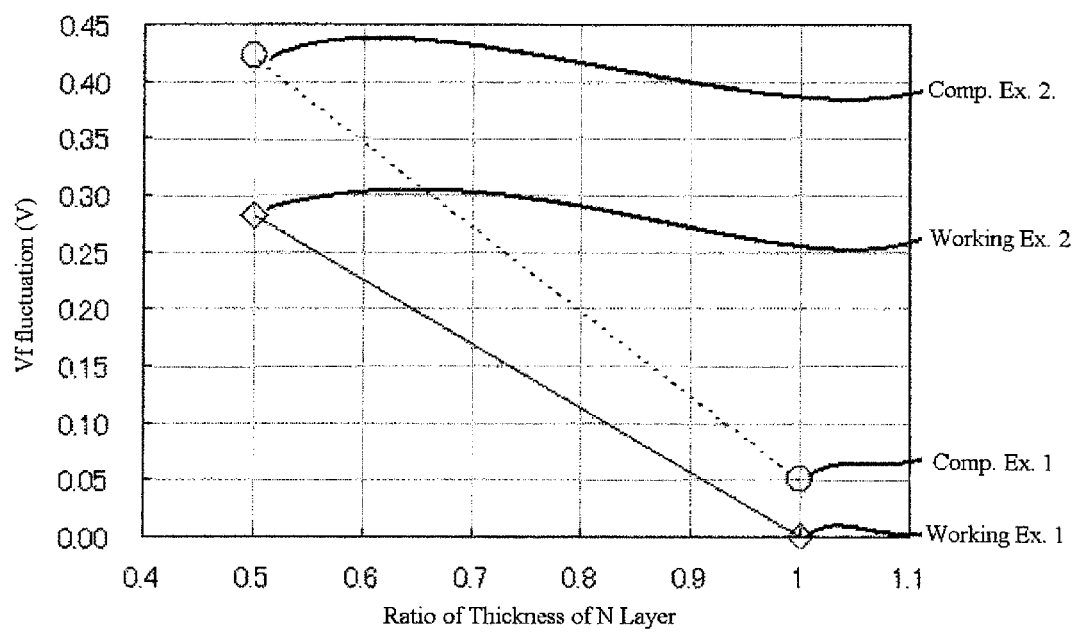
FIG. 9 is a simulation graph illustrating a Vf fluctuation of light of the semiconductor light emitting elements pertaining to the Working examples 1, 2 and Comparative examples 1, 2.

Further, as shown in FIG. 9, the Vf is kept lower in Working Example 1 than in Comparative Example 1. In particular, the difference between Working Example 2 and Comparative Example 2 is greater than the difference between Working Example 1 and Comparative Example 1, and the Vf reduction effect is more pronounced when the n-type semiconductor layer 21 is thinner.

The present invention can be used in various kinds of light source, such as illumination light sources, various indicator light sources, automotive light sources, display light sources, liquid crystal backlight light sources, sensor light sources, signaling devices, automotive parts, and signage channel letters.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A semiconductor light emitting element comprising:
    a semiconductor layer where an n-type semiconductor layer, a light emitting layer and a p-type semiconductor layer are laminated;
    an n-side electrode connected to the n-type semiconductor layer; and
    a p-side electrode connected to the p-type semiconductor layer;
    when the semiconductor light emitting element is viewed from above,
    the n-side electrode has a n-side pad electrode and an n-side extension, the n-side extension comprises an n-side first extension extending in a straight line from the n-side pad electrode toward a p-side pad electrode and an n-side second extension extending from the n-side first extension and forming a T shape with the n-side first extension,
    the p-side electrode has the p-side pad electrode and a p-side extension formed so as to surround the n-side electrode, the p-side extension comprises an p-side first extension extending from the p-side pad electrode parallel to the n-side second extension.

2. The semiconductor light emitting element according to claim 1, wherein
    a length of the n-side second extension is greater than the diameter of the p-side pad electrode.

3. The semiconductor light emitting element according to claim 1, wherein
    the p-side extension is formed C shape with a partial opening.

4. The semiconductor light emitting element according to claim 1, wherein
    the p-side extension further has a p-side second extension extending from the p-side first extension parallel to the n-side first extension, and
    the shortest distance between the p-side pad electrode and the n-side second extension is longer than the shortest distance between the p-side second extension and the n-side second extension.

5. The semiconductor light emitting element according to claim 4, wherein
    the p-side extension further has a p-side third extension extending from the p-side second extension toward the n-side first extension.

6. The semiconductor light emitting element according to claim 1, wherein
    the n-side pad electrode is larger than the p-side pad electrode.

7. The semiconductor light emitting element according to claim 5, wherein
    the p-side third extension extends perpendicularly from the p-side second extension.

8. The semiconductor light emitting element according to claim 4, wherein
    the p-side first extension and the p-side second extension are disposed at the outer periphery of the semiconductor light emitting element.

9. The semiconductor light emitting element according to claim 4, wherein
    the p-side second extension has a curved portion at the distal end and the curved portion is equidistant from the circular shape of the n-side pad electrodes.

10. The semiconductor light emitting element according to claim 1, wherein
    the semiconductor layer is formed from a nitride semiconductor.

11. A semiconductor light emitting element comprising:
a semiconductor layer where a p-type semiconductor layer, a light emitting layer and an n-type semiconductor layer are laminated;
two or more p-side electrodes connected to the p-type semiconductor layer; and
two or more n-side electrodes connected to the n-type semiconductor layer, wherein
when the semiconductor light emitting element is viewed from above,
each of the p-side electrodes has a p-side pad electrode and a p-side extension formed so as to surround each of the n-side electrodes,
the p-side extension comprises a p-side first extension extending from a corresponding one of the p-side pad electrodes and a p-side second extension extending from the p-side first extension,
each of the n-side electrodes has an n-side pad electrode and an n-side extension, the n-side extension comprising an n-side first extension extending in a straight line from the n-side pad electrode toward a corresponding one of the p-side pad electrodes and an n-side second extension extending from the n-side first extension into two directions toward the p-side second extension,
the p-side second extension disposed between adjacent ones of the n-side electrodes is shared by adjacent ones of the p-side electrodes.

12. The semiconductor light emitting element according to claim 11, wherein
the p-side extension further comprises a p-side third extension extending from the p-side second extension toward the n-side extensions.

13. The semiconductor light emitting element according to claim 12, wherein
the p-side third extension extends perpendicularly from the p-side second extension.

14. The semiconductor light emitting element according to claim 11, wherein
a length of the n-side second extension is greater than the diameter of the p-side pad electrode.

15. The semiconductor light emitting element according to claim 11, wherein
the p-side extension is formed C shape with partial opening.

16. The semiconductor light emitting element according to claim 11, wherein
the shortest distance between the p-side pad electrode and the n-side second extension is longer than the shortest distance between the p-side second extension and the n-side second extension.

17. The semiconductor light emitting element according to claim 11, wherein
the n-side pad electrode is larger than the p-side pad electrode.

18. The semiconductor light emitting element according to claim 11, wherein
the p-side first extension and the p-side second extension are disposed at the outer periphery of the semiconductor light emitting element.

19. The semiconductor light emitting element according to claim 11, wherein
the p-side second extension has a curved portion at the distal end and the curved portion is equidistant from the circular shape of the n-side pad electrodes.

20. The semiconductor light emitting element according to claim 18, wherein
The distal end of the p-side second extension is split and equidistant to the corresponding n-side pad electrodes.

21. The semiconductor light emitting element according to claim 11, wherein
the semiconductor layer is formed from a nitride semiconductor.

* * * * *